United States Patent [19]
Kohler

[11] Patent Number: 5,184,094
[45] Date of Patent: Feb. 2, 1993

[54] LOW POWER OSCILLATOR CIRCUITS
[75] Inventor: Raymond H. Kohler, Souderton, Pa.
[73] Assignee: Moore Products Co., Spring House, Pa.
[21] Appl. No.: 746,353
[22] Filed: Aug. 16, 1991
[51] Int. Cl.[5] .......................... H03B 5/06; H03B 5/36
[52] U.S. Cl. .............................. 331/158; 331/116 FE; 331/DIG. 3
[58] Field of Search ...... 331/116 R, 116 FE, 117 FE, 331/117 R, 158, DIG. 3

[56] References Cited
U.S. PATENT DOCUMENTS

| | | | |
|---|---|---|---|
| 3,585,527 | 6/1971 | Luscher | 331/116 R |
| 3,680,384 | 8/1972 | Grindheim | 340/186 X |
| 3,872,405 | 3/1975 | Gotou et al. | 331/111 |
| 3,878,483 | 4/1975 | Richardson | 331/57 |
| 3,979,693 | 9/1976 | Saari | 331/61 |
| 4,013,979 | 3/1977 | Vittoz | 331/108 B |
| 4,065,728 | 12/1977 | Saari | 331/75 |
| 4,242,665 | 12/1980 | Mate | 340/210 X |
| 4,282,496 | 8/1981 | Heuner | 331/116 FE |
| 4,387,349 | 6/1983 | Rapp | 331/116 FE |
| 4,459,565 | 7/1984 | Leach | 331/116 FE |
| 4,468,634 | 8/1984 | Takagi et al. | 331/60 |
| 4,613,829 | 9/1986 | Ott | 331/116 FE X |
| 4,628,282 | 12/1986 | Hikawa et al. | 331/1 A |
| 4,651,113 | 3/1987 | Fujita | 331/116 FE X |
| 4,785,264 | 11/1988 | Kaltenecker et al. | 331/117 FE |
| 4,810,976 | 3/1989 | Cowley et al. | 331/117 R |
| 4,831,343 | 5/1989 | Baron | 331/116 FE X |
| 4,864,256 | 9/1989 | Barnert | 331/116 R |
| 4,922,210 | 5/1990 | Flachenecker et al. | 331/167 |
| 4,956,618 | 9/1990 | Ulmer | 331/116 FE |
| 4,985,687 | 1/1991 | Long | 331/69 |

Primary Examiner—David Mis
Attorney, Agent, or Firm—Synnestvedt & Lechner

[57] ABSTRACT

Low power oscillator circuits for providing clock signals. The circuits comprise crystal oscillators for providing an input wave form of a specified frequency to the clock circuit, square wave generators having at least two input terminals wherein one of the two input terminals is coupled to the oscillator, and a power output network coupled to the square wave generator for outputting a substantially square wave having substantially the same frequency as the input wave form, the power output network being biased at a high voltage level. Clock circuits described herein provide the advantage of low power oscillation with little power dissipation.

22 Claims, 2 Drawing Sheets

LOW POWER OSCILLATOR CIRCUITS

FIELD OF THE INVENTION

This invention relates generally to clock circuitry for electronic instrumentation. More specifically, this invention relates to oscillator circuits to produce clock signals.

BACKGROUND OF THE INVENTION

Process control is a long-established art which plays a major role in managing industrial plants and processes. In this art, process transmitters have been used to monitor process variables. Having evolved from the earliest measurement devices such as barometers and thermometers, the process transmitter has traditionally received a great deal of technological attention to improve performance due to the need for accurate process measurement. Since the accuracy of every measurement made in a process control loop is directly dependent upon the accuracy of the particular process transmitter or instrument which closes the loop, the process transmitter plays a particularly sensitive role in industrial process control systems.

Beginning in the 1950s, electrical and electronic process control loops were a natural development from prior electromechanical control systems. The general problem of electronic process control is to convert a physical variable to an electrical signal, and to subsequently transmit that signal to a recorder and/or other control equipment which may be located some distance away from the physical variable. Early types of process control loops to accomplish this goal were "four-wire" systems, and were configured such that operating power was supplied through two of the four wires and a process signal was transmitted through the other two wires. The four-wire system requires the use of amplifiers or other signal conditioning equipment at the point of measurement in order to supply an accurate signal representative of the physical variable since the process signal is generally very low. See, e.g., U.S. Pat. No. 3,680,384, of Grindheim. Prior four-wire transmitter systems thus required separate power supply lines, and voltage power supplies.

After the four-wire transmitter was developed, it became apparent that the advantages of using the same two wires for power supply and information transmission would greatly improve the process control art. The "two-wire" transmitter was then developed and operates today in a control loop in conjunction with an external power supply, a pair of wires from the supply, and a transmitter connected serially between the wires. As used herein, the term "two-wire" is construed broadly to mean two conductors. Thus, the term "two-wire" includes actual wires, twisted pairs, coaxial cables, and other pairs of conductors.

During operation of such a two-wire transmitter loop, the transmitter energizes a sensor element and receives informational signals from the sensor element. The information is transmitted on the pair of wires by varying the current in the current loop. Thus the transmitter acts as a variable current sink, and the amount of current which it sinks is representative of the information from the sensor. Such prior two-wire transmitter loops have generally been analog in nature, and the industry standard which has developed for two-wire transmitters is a 4 to 20 milliamp loop, with a variable loop supply voltage having a maximum output of 24 volts DC. With such a low voltage supply, two-wire transmitter loops are particularly suited for use in hazardous environments. See, e.g., U.S. Pat. No. 4,242,665, of Mate.

More advanced prior two-wire transmitter control loops exhibit high-level data communication between two-wire transmitters and various receiving elements, for example controllers and communication devices. The concept of digital communication in 4 to 20 milliamp control systems is known for use in the more complicated 4 to 20 milliamp loops having both digital and analog components. Transmitters suitable for such purposes are usually called "smart" transmitters because they are more accurate and have operating parameters which may be remotely controlled.

As technology has progressed over the years, low powered microprocessors have made it possible to transport smart field transmitters into the digital signal processing environment. Furthermore, digital microprocessors make it possible to improve the accuracy of smart two-wire transmitters. Since digital microprocessors are typically used in the transmitters, a clock or oscillator circuit is required to provide a system clock to the central processing unit (CPU) which effectively runs the digital microprocessor and the transmitter's digital components.

The trend in two-wire transmitter loops both in the smart, microprocessor-based transmitter area and the traditional analog transmitter area, has been to reduce the power requirements for components which are used in the loop. This need has arisen since the amount of power which a two-wire transmitter may draw from a current loop to use for its operation is severely limited. With a nominal 10-volt supply, at the bottom end of operation only about 40 milliwatts is available to power any instrumentation in the loop. Thus with large power demands on the loop, two-wire control systems may be limited to a few low power industrial control applications. This aspect of industrial controls competes with the general desire to design instrumentation into the loop to simplify loop operation and installation, and to provide intrinsic safety in a low power process control environment. This long-felt need has not adequately been met by process control loops which have the aforementioned inherent power budget problems.

System components, for example, the aforementioned system clock, must therefore be low power components which do not unduly load the transmitter. It is thus important to provide oscillator components in a two-wire transmitter and control loop with improved power consumption efficiencies to enlarge the scope of versatility of such transmitters in low power two-wire systems.

SUMMARY OF THE INVENTION

In accordance with the present invention, a clock circuit is provided having low operating power requirements. The clock circuit preferably comprises oscillator means for providing an input waveform of a specified frequency to the clock circuit, generator means biased at a first voltage having at least two input terminals wherein one of the two input terminals is coupled to the oscillator means for producing a substantially square wave output having a square wave frequency corresponding substantially to the input waveform frequency, and power output means coupled to the generator means for outputting a substantially square wave having substantially the same frequency as the input waveform, the power output means being biased at a higher voltage level than the generator means.

Methods of producing an oscillatory voltage output are also provided in accordance with the present invention. Preferably, the methods comprise the steps of exciting a first oscillatory voltage signal having a first frequency, generating a square wave voltage signal in response to the first oscillatory voltage signal, the square wave voltage having substantially the same first frequency, biasing an output voltage to a low output value with a direct current biasing voltage, and driving the output voltage with the square wave voltage such that the output voltage has substantially the first frequency.

Clocks and oscillator circuits provided in accordance with the present invention and for running system CPU's and associated circuitry provide the advantageous result of low power loading of a fixed power supply in the system. Prior clock circuits generally draw approximately 1 milliamp of operating current or almost 3.5 milliwatts of power when the power supply is operating at a nominal 3.5 volts. In contrast, clocks provided in accordance with the present invention draw less than 130 microamps current, or less than about 0.45 milliwatts at 3.5 volts. This is a substantially lower driving power than has been previously required, and greatly increases the efficiency of two-wire transmitters utilizing clocks as taught herein.

Furthermore, clocks and oscillators in accordance with the present invention provide the benefit of series mode oscillators, that is, fast start up and quick switching, coupled with the benefits of parallel oscillators, that is, low power requirements. Clocks and oscillator circuits provided in accordance with the present invention also have a high band width, high gain output for efficient driving of any system circuitry requiring clock signals. These results have not heretofore been achieved with prior clocks and oscillator circuits which have been used in two-wire transmitters and control loops in the past.

DETAILED DESCRIPTION OF PREFERRED EMBODIMENTS

Figure 1:
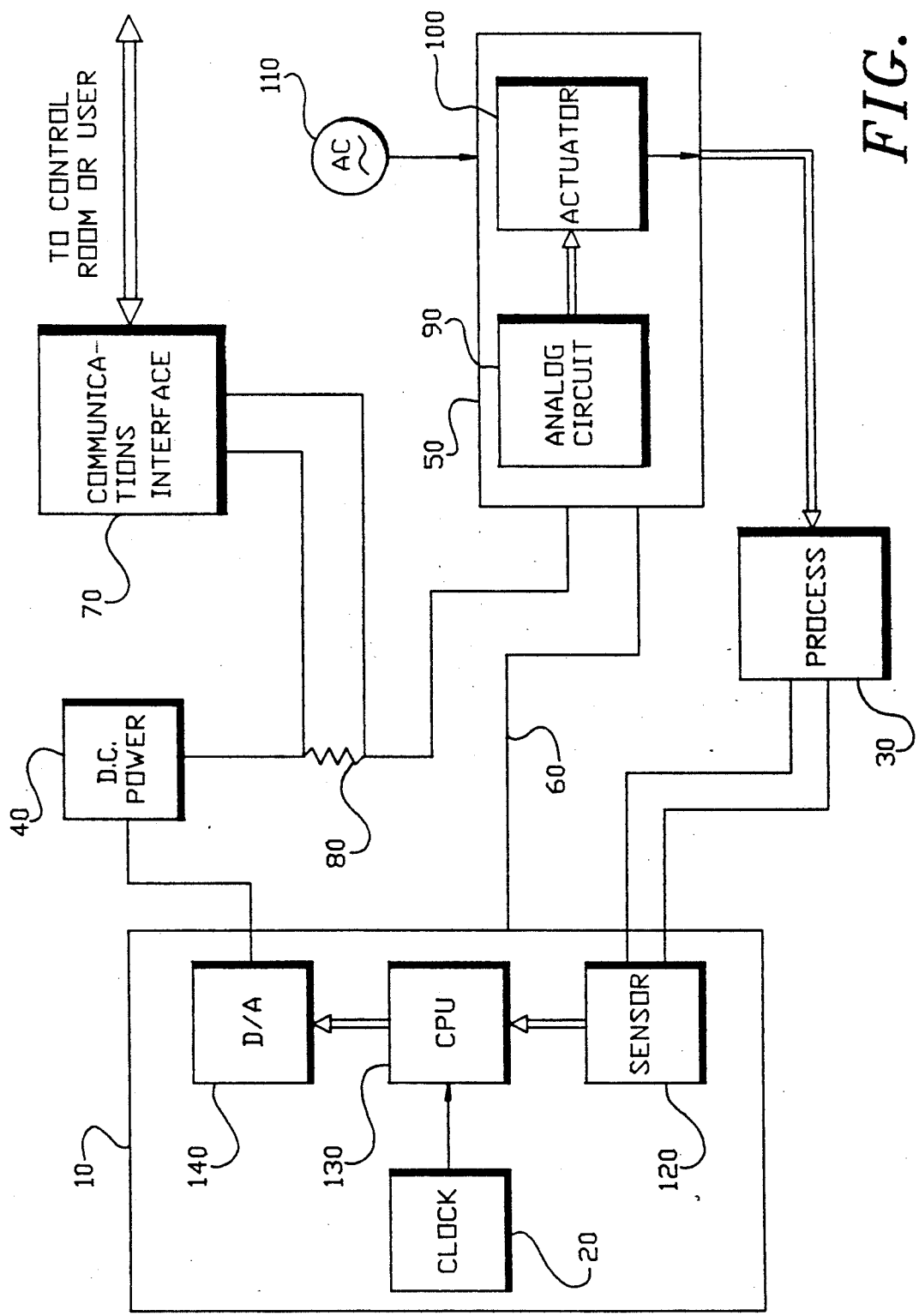
FIG. 1 is a block diagram of a two-wire transmitter control loop utilizing a clock circuit provided in accordance with the present invention.

Referring to the drawings wherein like reference numerals refer to like elements, in FIG. 1 a process control loop utilizing a transmitter 10 in accordance with the present invention having a low power clock circuit 20 to provide clock signals to the electronics in the transmitter is shown. The transmitter 10 provides transmitter functions to the loop, and also may provide control functions to the loop to control the process shown schematically at 30. The process 30 may be any type of industrial fluid flow process, or a temperature, capacitance, differential pressure, or other type of industrial process having a process variable which it is desired to control.

A DC power supply 40 provides DC power to the analog loop and powers the transmitter 10. In addition, a control element 50 is interfaced in the loop and receives a 4 to 20 milliamp output signal 60 from the transmitter 10 which is indicative of the state of the process variable, and may also be a control current to provide control functions for the process 30. A communications interface 70 is also preferably interfaced to the loop at 80 so that bidirectional, digital communications can appear on the loop and be bussed to the control room, for example. The bidirectional communication signal is preferably a digital signal which rides on top of the 4 to 20 milliamp analog signal 60 to provide loop information concerning the process variable and other loop parameters to the control room or a user of the control loop while allowing the 4 to 20 milliamp analog signal 60 to fulfill the routine control and transmission functions in the loop.

In final control element 50, an analog circuit 90 is preferably interfaced with the loop and is adapted to receive the 4 to 20 milliamp analog control signal 60. The analog circuit 90 interprets the 4 to 20 milliamp analog control and transmitter signal 60 and busses the signal to an actuator 100 which is interfaced with the process 30 to provide process control according to the desired control state output by the transmitter 10. The actuator 100 could be interfaced with an electromechanical valve, for example, when the process is a fluid flow process, and may therefore be independently powered by an AC power supply 110 interfaced with the final control element 50 to provide additional power to the actuator 100 for electromechanical control of the process 30 and its process variable. It will be recognized by those with skill in the art that other types of actuating and control elements are possible with the control loop of FIG. 1, depending on the particular industrial process or processes being monitored and controlled.

In the transmitter 10, a sensor 120 is interfaced with the process and transduces a signal indicative of the process variable to the CPU 130. The CPU 130 preferably performs both transmitter and control functions for the control loop of FIG. 1 and receives a clock signal from clock circuit 20. A digital to analog (D/A) converter 140 receives the control and transmitter signals from the CPU, which are in digital form. The D/A 140 preferably converts the digital CPU signals to analog transmitter signals in the 4 to 20 milliamp analog range which are then output to the loop at 60.

In preferred embodiments, the clock circuit 20 in accordance with the present invention provides about a two megahertz clock signal and more preferably a 1.8432 megahertz clock signal to the CPU 130. However, it will be recognized by those with skill in the art that higher clock signals are possible. Thus, signals from 100 kilohertz to 100 megahertz are possible with clock circuits provided in accordance with the present invention.

Figure 2:
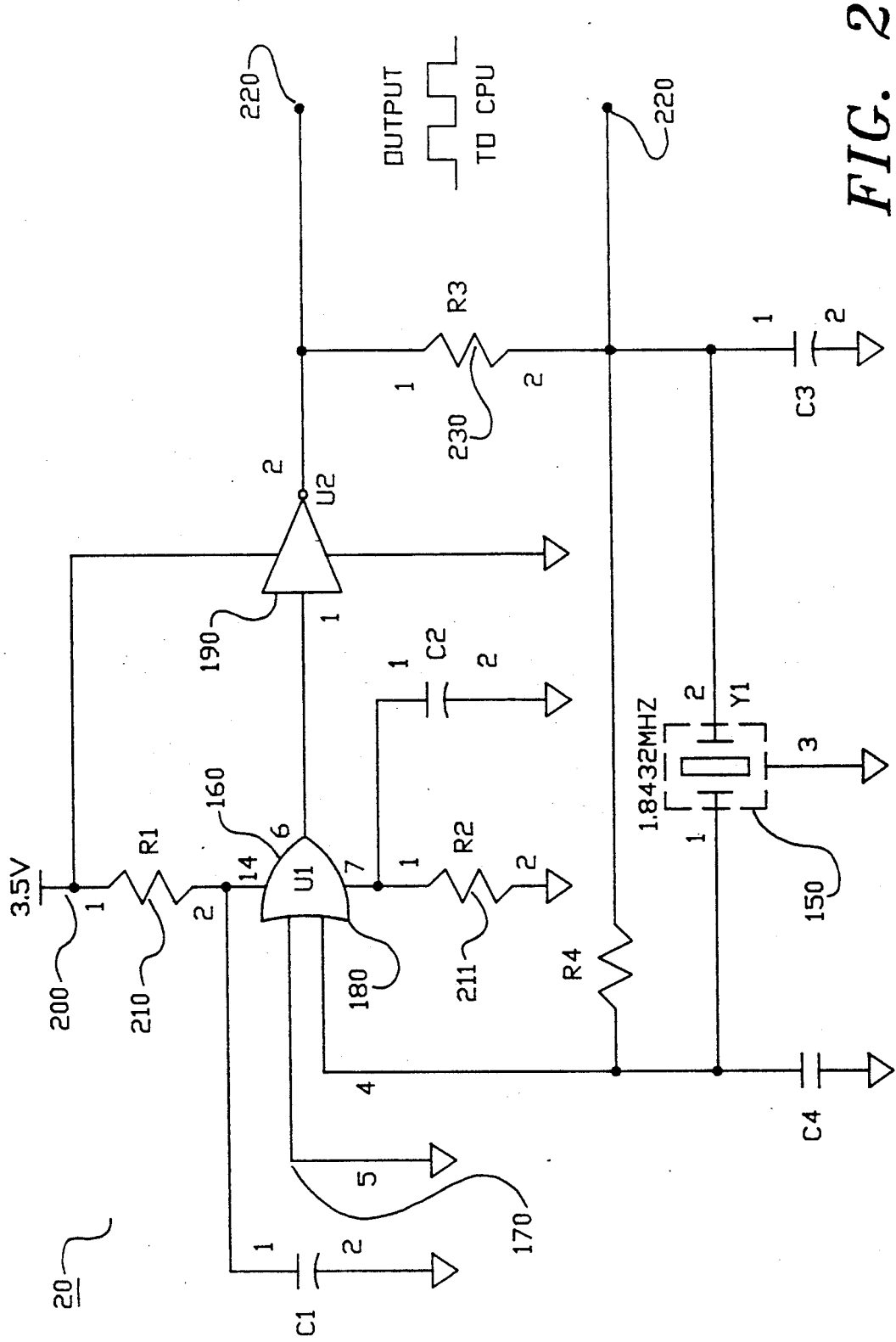
FIG. 2 is a schematic of a clock circuit having a crystal oscillator to provide a clock frequency provided in accordance with the present invention.

Referring to FIG. 2, a schematic diagram of a preferred embodiment of clock circuit 20 is shown. The clock circuit preferably comprises oscillator means 150 for providing an input waveform of a specified frequency to the clock circuit. Generator means 160 having at least two input terminals 170 and 180 are provided such that input terminal 180 is coupled to oscillator means 150. The generator means preferably produces a substantially square wave output having a square wave frequency corresponding substantially to the input waveform frequency. Power output means 190 are coupled to the generator means 160 and preferably produces an output square wave having substantially the same frequency as the input waveform.

The power output means 190 is further preferably powered by a DC voltage supply 200 which also biases the generator means 160. Two ballasting resistors 210 and 211 coupled to the DC voltage supply 200 and to generator means 160 ensure that the generator means is biased at a lower voltage value than the power output means 190. The output of power output means 190 appears at terminals 220 which are connected to the CPU 130 in preferred embodiments.

In a further preferred embodiment the clock circuit 20 of FIG. 2 is a "parallel" oscillator. As used herein, the term parallel oscillator means that the oscillating means 150 operates in a parallel resonance mode. Such a parallel oscillator is generally recognized as having a slower startup time, but has the benefit of being a low power oscillating circuit. In accordance with the present invention, the use of generating means 160 and power output means 190 both being biased by biasing voltage 200 provides the advantage of fast startup for the circuit even though the circuit is operating in a parallel mode. This fast startup is accomplished even though circuit 20 is a parallel oscillator, and thus circuit 20 attains the benefits of a "series mode" oscillator, wherein oscillating means 150 would be in series with generating means 160.

This fast startup, low power advantage is attained by use of high gain, wide bandwidth output means 190 which in a preferred embodiment is an inverting amplifier comprising field effect transistors (FETs) with gates. Normally, the gates in inverting amplifier 190 in their linear ranges draw a considerable amount of power. In a preferred embodiment, the gates are driven through their mid-regions and operate at their endpoints such that the FETs in the inverting amplifier 190 operate at the endpoint of their biased ranges. This is accomplished by biasing inverting input 190 with a 3.5 volt supply 200.

Generating means 160 further reduces the power input to the inverting amplifier 190 since it is also biased. In a preferred embodiment, generating means 160 is a CMOS OR gate having complimentary single N-type and P-type FETs to provide a generated square wave output having substantially the same frequency as the oscillating means 150.

In a further preferred embodiment, two ballasting resistors 210 and 211 lower the voltage which biases OR gate 160 such that only one N-type or P-type FET is on at a single time, but both are preferably never on at the same time. A feedback loop through resistor R3 at 230 controls which FET is on in the OR gate 160, and the ballasting resistors 210 and 211 further provide passive regulation of both the FETS in the OR gate. If both FETs conduct current, the ballasting resistors lower the voltage to OR gate 160, turning one FET off.

In this fashion, a square wave output from OR gate 160 drives the inverting amplifier 190 to give a higher output voltage than the output square wave voltage of OR gate 160 at substantially the same frequency as the oscillating means 150. In a further preferred embodiment, oscillating means 150 is a crystal oscillator having a 1.8432 megahertz oscillating frequency. However, other frequencies are possible with clock circuits having crystal oscillators provided in accordance with the present invention.

Thus, since the operating power of the square wave clock signal produced by OR gate 160 is effectively reduced, the FETS in OR gate 160 travel from rail to rail very quickly and drive through their linear ranges to opposite operating endpoints. Furthermore, since inverting amplifier 190 is operated in a high gain mode, the system begins to oscillate on bare parasitic signals and thus requires only minimal power to drive the system clock to output a square wave signal to the CPU for example. In accordance with the present invention, less than about 130 microamps is required to begin oscillation of the circuit 20 shown in FIG. 2.

Circuit components R3, C3, and C4 provide a feedback path which is necessary for oscillation, and resistor R4 provides DC bias. Capacitors C1 and C2 preferably provide a low impedance path for generating means 160 to drive the input to invertor 190.

The various values for the circuit components shown in FIG. 2 appear in the following table:

TABLE 1

| R1 | 8.2 Kohms |
|----|-----------|
| R2 | 8.2 Kohms |
| R3 | 78 Kohms |
| R4 | 22 Megohms |
| C1 | 0.01 Microfarads |
| C2 | 0.01 Microfarads |
| C3 | 5 Picofarads |
| C4 | 2 Picofarads |
| Y1 | 1.8432 MHZ |

Clock circuits provided in accordance with the present invention provide high efficiency clock signals for electronic components such as those found in two-wire transmitters and process control loops. These clock circuits and methods of providing clock signals provide low power, high frequency clock signals while allowing effective power budget management for the electronics in two-wire transmitter systems. Circuits provided in accordance with the present invention are accomplished with common circuit elements and are thus efficient and economic to implement. These results have not heretofore been achieved in the art and greatly enhance two-wire transmitters for use in process control loops.

There have thus been described certain preferred embodiments of low power clock circuits and methods of low power clock signals provided in accordance with the present invention. While preferred embodiments have been described and disclosed, it will be recognized by those with skill in the art that modifications are within the true spirit and scope of the invention. The appended claims are intended to cover all such modifications.

What is claimed is:

1. A clock circuit comprising:
   resonator means for providing an input waveform of a specified frequency to the clock circuit;
   generator means biased at a first voltage having at least two input terminals wherein one of the two input terminals is coupled to the resonator means for producing a substantially square wave output having a square frequency corresponding substantially to the input waveform frequency; and
   power output means coupled to the generator means for outputting a substantially square wave having substantially the same frequency as the input waveform, the power output means being biased at a higher voltage level than the generator means, such that the power output means is biased at the ned of its biased range.

2. The clock circuit recited in claim 1 wherein the generator means is an OR gate and the second input terminal is connected to ground.

3. The clock circuit recited in claim 2 wherein the power output means is an inverting amplifier.

4. The clock circuit recited in claim 3 wherein the inverting amplifier is biased to about 3.5 volts.

5. The clock circuit recited in claim 4 further comprising ballasting resistor means for biasing the OR gate to the first voltage.

6. The clock circuit recited in claim 5 wherein the OR gate and inverting amplifier are connected in series, and the OR gate and inverting amplifier combination are further connected in parallel with the resonator means.

7. The clock circuit recited in claim 6 wherein the resonator means is a crystal resonator.

8. The circuit recited in claim 7 where the crystal resonator outputs a signal having a frequency of about two megahertz.

9. A parallel oscillator comprising:
crystal resonator means for producing an oscillating excitation signal at a frequency;
square wave generating means in parallel with the crystal resonator means for producing a square wave voltage having a frequency substantially the same as the frequency of the crystal resonator means;
basing means for biasing the square wave generating means; and
output means adapted to receive the square wave voltage output from the square wave generating means and biased to a first voltage level by the biasing means for outputting a square voltage wave at substantially the same frequency as the crystal resonator means, wherein the biasing means drives the output means to the end of the output means biased range, thereby producing a low output power voltage waveform.

10. The parallel oscillator recited in claim 9 wherein the square wave generating means is an OR gate having a first input connected to the crystal resonator means and a second input grounded.

11. The parallel oscillator recited in claim 10 further comprising ballasting resistor means connected to the biasing means for biasing the OR gate to a second voltage level.

12. The parallel oscillator recited in claim 11 wherein the output means is an inverting amplifier.

13. The parallel oscillator recited in claims 12 wherein the first voltage level is about 3.5 volts.

14. The parallel oscillator recited in claim 13 further comprising a feedback loop between the inverting amplifier and the OR gate for controlling the oscillation of the parallel oscillator.

15. The parallel oscillator recited in claim 9 wherein the excitation frequency is about two megahertz.

16. A method of producing an oscillatory voltage output comprising the steps of:
exciting a first oscillatory voltage signal having a first frequency;
generating a square wave voltage signal in response to the first oscillatory voltage signal, the square wave voltage having substantially the same first frequency;
biasing an output amplifier to the end o fits biased range with a direct current biasing voltage; and
driving the output amplifier with the square wave voltage, such that an output voltage has substantially the first frequency.

17. The method recited in claim 16 further comprising the step of ballasting a square wave generator for producing the square voltage signal to a voltage level with the direct current biasing voltage.

18. The method dated in claim 17 wherein the driving step comprises the step of inverting the square wave voltage with an inverting amplifier.

19. The method recited in claim 18 further comprising the step of feeding back the output voltage to the square wave generator to generate the oscillatory voltage signal.

20. The method recited in claim 19 wherein the square wave generator is an OR gate.

21. The method recited in claim 20 wherein the biasing step comprises the step of biasing the inverting amplifier to 3.5 volts.

22. The method recited in claim 21 wherein the first oscillating voltage signal has a frequency of about two megahertz.

* * * * *